(12) United States Patent
Bayley et al.

(10) Patent No.: US 9,008,319 B2
(45) Date of Patent: Apr. 14, 2015

(54) SOUND PRESSURE LEVEL LIMITER WITH ANTI-STARTLE FEATURE

(75) Inventors: Antony M W. Bayley, Wooton Bassett (GB); William R. Morrell, Santa Cruz, CA (US); Iain J. McNeill, Aptos, CA (US); Kwangsee A. Woo, Scotts Valley, CA (US)

(73) Assignee: Plantronics, Inc., Santa Cruz, CA (US)

( * ) Notice: Subject to any disclaimer, the term of this patent is extended or adjusted under 35 U.S.C. 154(b) by 3322 days.

(21) Appl. No.: 11/027,064

(22) Filed: Dec. 30, 2004

(65) Prior Publication Data

US 2006/0147049 A1    Jul. 6, 2006

(51) Int. Cl.
| | |
|---|---|
| H04R 29/00 | (2006.01) |
| H03F 99/00 | (2009.01) |
| H03G 3/00 | (2006.01) |
| H03G 7/00 | (2006.01) |
| H03G 9/00 | (2006.01) |
| H03G 11/00 | (2006.01) |

(52) U.S. Cl.
CPC ............... *H03G 3/001* (2013.01); *H03G 7/007* (2013.01); *H03G 9/005* (2013.01); *H03G 11/008* (2013.01)

(58) Field of Classification Search
USPC ........... 381/56–59, 102, 110, 83, 93, 318, 55, 381/104–108; 379/388.03, 390.03, 390.01, 379/88.03; 704/225, 231, 233
See application file for complete search history.

(56) References Cited

U.S. PATENT DOCUMENTS

| | | | | |
|---|---|---|---|---|
| 5,526,419 A | * | 6/1996 | Allen et al. ................... | 379/391 |
| 5,822,018 A | * | 10/1998 | Farmer ......................... | 348/705 |
| 6,420,986 B1 | * | 7/2002 | Shahaf et al. ................. | 341/139 |
| 6,760,453 B1 | * | 7/2004 | Banno ........................... | 381/107 |
| 6,914,990 B2 | * | 7/2005 | Abe ............................... | 381/104 |
| 7,024,011 B1 | * | 4/2006 | Hamacher et al. ............ | 381/320 |
| 7,058,188 B1 | * | 6/2006 | Allred ........................... | 381/107 |
| 7,177,805 B1 | * | 2/2007 | Oh et al. ....................... | 704/225 |
| 2004/0037428 A1 | * | 2/2004 | Keller ............................ | 381/60 |
| 2005/0018862 A1 | | 1/2005 | Fisher | |
| 2005/0105717 A1 | | 5/2005 | Lawrie | |

FOREIGN PATENT DOCUMENTS

| | | |
|---|---|---|
| GB | 2179810 A1 | 3/1987 |
| WO | WO03003790 A1 | 1/2003 |
| WO | WO2005094743 A1 | 10/2005 |

OTHER PUBLICATIONS

Australian Communications Industry Forum, ACIF G616:2004 Guideline Acoustic Safety for Telephone Equipment, Australia.
Choy G et al., "Subband-Based Acoustic Shock Limiting Algorithm on a Low Resource DSP System", Eurospeech, 2003, pp. 2869-2872, XP007007046, paragraphs[0001]-{0003].

* cited by examiner

*Primary Examiner* — Xu Mei

(57) ABSTRACT

Sound pressure level limiter with anti-startle feature for audio systems are disclosed. The anti-startle feature may be implemented with a delta incident detector for detecting delta acoustic incidents that exceed a predetermined acoustic startle boundary, a delta limiter for determining an anti-startle gain, and an amplifier to apply the anti-startle gain to the input signal. The delta incident detector may detect delta incidents based on an estimated true SPL delivered by a transducer to a predetermined datum point. The estimated true SPL may be determined by based on a measured receiving frequency response of the transducer. An SPL limiter may also determine an SPL gain in response to detecting an SPL acoustic incident that exceeds a predetermined SPL threshold, and an amplifier may apply the SPL gain to the input signal to reduce it below the threshold.

32 Claims, 7 Drawing Sheets

Anti-Startle Boundary for Delta Detector Derived from Published Data

Anti-Startle Boundary for Delta Detector with Minimum Delta Requirement

Measured Delta-Detector Response

Delta Limiter Response

Combined Delta Limiter and SPL Limiter Response

SOUND PRESSURE LEVEL LIMITER WITH ANTI-STARTLE FEATURE

BACKGROUND OF THE INVENTION

1. Field of the Invention

The present invention relates generally to signal processing. More specifically, systems and methods for sound pressure level limiter with anti-startle feature for systems such as those that play sound via an audio device located close to the listener's ear or via a loudspeaker or other transducer located distant from the listener are disclosed.

2. Description of Related Art

Proper control of acoustic signal levels in communications and other audio output devices is desirable to ensure high quality audio output and hearing comfort to the users. For example, a telephone headset provides a speaker contained within an earpiece positioned over the user's ear. To ensure acoustic safety and high acoustic quality, the sound level of the acoustic signal emitted by the speaker should fall within a specified sound intensity range. Above the specified intensity range, the excessive sound level may cause discomfort for the user and/or the user's hearing. Thus, excessively high sound levels are of particular concern in communication and other audio devices such as telephone handsets and headsets and other listening devices that position a speaker near the user's ear.

Excessively high sound levels may be caused by various events. For example, accidental disturbances within a communication connection, such as an amplifier malfunction, intense feedback, incorrect signal source, and/or a phone line shorted to a power line, may cause dramatic increases in the electrical signal level input to a transducer that converts electrical signals to acoustic signals. The transient time for the acoustic signal to reach excessively high levels may be very short, such that a user often does not have sufficient time to move the listening device away from the ear in time to prevent exposure to the high sound levels. Although a handset user may be able to quickly move the handset speaker away from the ear as the user is typically already holding the handset in the hand, it may take a hands-free headset user longer to bring the hand to the headset in order to move the headset earpiece away from the ear. Furthermore, headsets are particularly suitable for users who are on the telephone for long periods of time, e.g., telemarketers, receptionists, and operators. Thus, because of the extra time required to remove a headset away from the ear and the potentially longer periods of headset usage, headset users may be particularly vulnerable to exposure to excessively high sound levels caused by sudden or constant loud audible signals.

Many countries have legislation limiting the maximum sound pressure level (SPL) that telephone equipment, including headsets, may produce. Noise exposure legislation is intended to prevent noise-induced hearing loss. The legal maximum SPL is generally relatively high, e.g., approximately 118 dB SPL or 118 dB(A) SPL, and is extremely loud when compared with normal telephone speech. Thus, telephone handsets and headsets that comply with the law can nonetheless cause user discomfort due to loud sound levels and may also startle the telephone or headset user due to sudden increases in the sound level from relatively quiet to relatively loud.

Reducing or removing sounds that are significantly louder than normal speech, even those sounds below the legal limits, may help enhance the comfort of telephone or headset users. User comfort may also be improved by preventing acoustic startle, i.e., the involuntary contraction of bodily muscles resulting from unexpected moderate or intense acoustic stimuli with rapid onset. In a quiet environment, even sound levels as low as 50 dB SPL, similar to or below normal telephone speech levels, can cause acoustic startle.

Headsets and other audio output devices often employ audio limiting devices on the receiver input terminals in order to limit the voltage and thus the maximum sound level from the headset receiver. Most conventional audio limiting devices either clip or compress the electrical signal that drives the headset, which prevents the electrical signal from exceeding a specified peak-to-peak or root mean square (rms) voltage. However the sound pressure level produced by the headset is determined at least in part by the receiving sensitivity of the headset, which in turn depends on the headset model and can generally vary significantly with frequency. Thus current methods for clipping or compressing the electrical signal require that these worst case tolerances are accounted for, which may sometimes result in lower overall levels than are necessary or desirable.

Thus, it would be desirable to provide an audio output device that limits sounds that exceed a specified sound pressure level threshold and thus prevent discomfort caused by loud sounds. It would also be desirable to provide an audio output device that reduces the likelihood and intensity of acoustic startle.

SUMMARY OF THE INVENTION

Systems and methods for sound pressure level limiter with anti-startle feature for systems such as those that play sound via an audio device located close to the listener's ear or via a loudspeaker or other transducer located distant from the listener are disclosed. It should be appreciated that the present invention can be implemented in numerous ways, including as a process, an apparatus, a system, a device, or a method. Several inventive embodiments of the present invention are described below.

The anti-startle feature generally involves detecting fast rise time signals that are likely to cause acoustic startle and slowing the rise time of such signals. The anti-startle feature may be implemented with a delta incident detector for detecting delta acoustic incidents that exceed a predetermined acoustic startle boundary, a delta limiter for determining an anti-startle gain, and an amplifier to apply the anti-startle gain to the input signal. The predetermined acoustic startle boundary may be a function of signal rise time and sound pressure level (SPL) increase. The delta incident detector may detect delta incidents based on an estimated true SPL delivered by a transducer to a predetermined datum point. The estimated true SPL may be measured with a microphone located at, or close to, the chosen datum point (e.g. a microphone located in the headset receiver assembly). Alternatively the true SPL may be estimated based on the electrical signal that drives the headset receiver and the measured receiving frequency response of the transducer. An SPL limiter may also be implemented with or without the anti-startle feature to determine an SPL gain in response to detecting an SPL acoustic incident that exceeds a predetermined SPL threshold, the detection of the SPL acoustic incident may be based on the estimated true SPL.

The anti-startle gain can be associated with an anti-startle gain limit and release time. Thus, upon detection of a delta acoustic incident by the delta incident detector, the delta limiter may set the anti-startle gain to the anti-startle gain limit and then enter a delta limiter release phase in which the delta limiter increases the anti-startle gain over a period of time associated with the anti-startle release time until the anti-startle gain reaches unity (1).

In another embodiment, an audio signal processing system may generally include a true SPL processor configured to estimate true SPL delivered by a transducer at a predetermined datum point from input signals, an acoustic incident detector configured to detect acoustic incidents based on the estimated true SPL and on a predetermined acoustic incident threshold, an acoustic incident limiter configured to determine an acoustic incident gain in response to the acoustic incident detector detecting an acoustic incident, and an amplifier configured to apply the acoustic incident gain to the input signal. The function of these elements is to prevent the SPL from exceeding the predetermined acoustic incident threshold, and in many cases to reduce it substantially below the threshold.

A method for audio signal processing generally includes detecting delta acoustic incidents in input signals that exceed a predetermined acoustic startle boundary, determining an anti-startle gain in response to the delta incident detector detecting a delta acoustic incident, the anti-startle gain having an anti-startle gain limit and an anti-startle release time associated therewith, and applying the anti-startle gain to the input signals.

An audio signal processing method generally includes estimating a true sound pressure level (SPL) delivered by a transducer at a predetermined datum point from input signals, detecting an acoustic incident based on the estimated true SPL and on a predetermined acoustic incident threshold, determining an acoustic incident gain in response to the acoustic incident detector detecting an acoustic incident, and applying the acoustic incident gain to the input signal.

These and other features and advantages of the present invention will be presented in more detail in the following detailed description and the accompanying figures which illustrate by way of example principles of the invention.

BRIEF DESCRIPTION OF THE DRAWINGS

The present invention will be readily understood by the following detailed description in conjunction with the accompanying drawings, wherein like reference numerals designate like structural elements.

DESCRIPTION OF SPECIFIC EMBODIMENTS

Systems and methods for sound pressure level limiter with anti-startle feature for systems such as those that play sound via an audio device located close to the listener's ear or via a loudspeaker or other transducer located distant from the listener are disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

Figure 1:
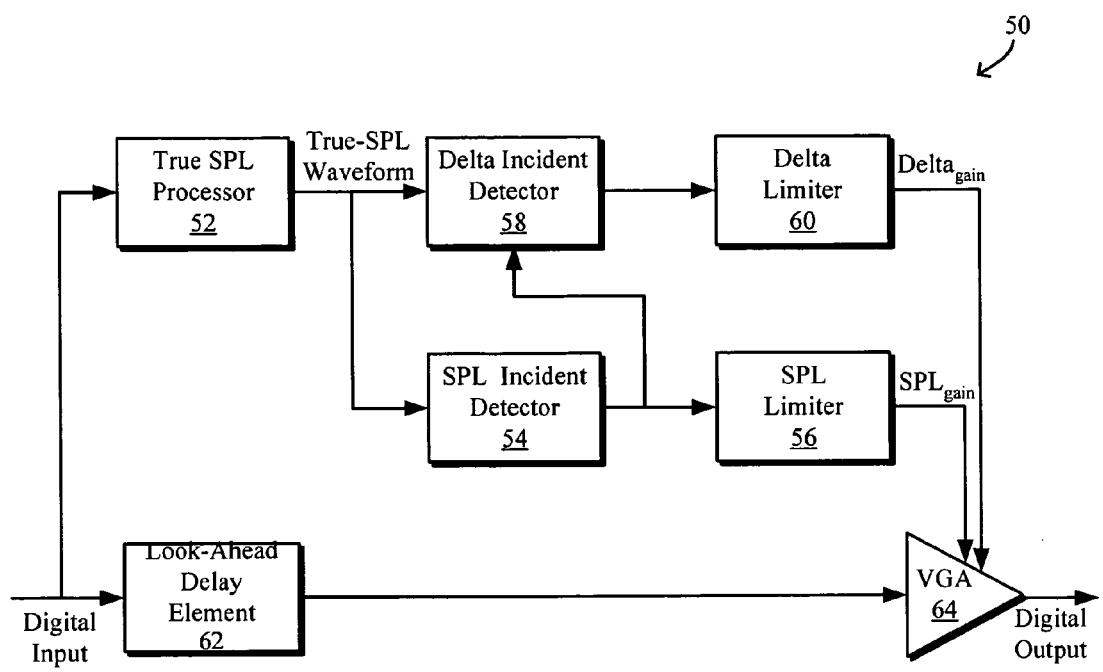
FIG. 1 is a block diagram illustrating an exemplary audio processing system implementing sound pressure level (SPL) limiting and anti-startle features.

FIG. 1 is a block diagram illustrating an exemplary audio processing system 50 implementing sound pressure level (SPL) limiting and anti-startle features. The systems and methods described herein may be utilized for audio devices located close to the listener's ear such as a headset, handset, mobile phone, headphone, or earphone, as well as audio devices located at a distant to the listener's ear such as loudspeakers or other transducers located distant from the listener.

As shown, the audio processing system 50 generally includes a true SPL estimator or processor 52, an SPL incident detector 54, an SPL limiter 56, a delta incident detector 58, a delta limiter 60, a look-ahead delay element 62, and a variable gain amplifier (VGA) 64. The processing by the components of the system 50 is typically carried out in the digital domain. Thus analog to digital converter (ADC) and digital to analog converter (DAC) are typically provided at the input and the output but are not shown for purposes of clarity. Within the audio processing system 50, the audio signal passes only through the delay element 62 and the amplifier 64 and the remaining components, i.e., the true SPL processor 52 and the SPL and delta incident detectors and limiters 54-60, implement signal analysis and gain control functions.

The true SPL processor 52 estimates the sound pressure level at the user's ear, thus allowing the audio processing system 50 to use the estimated true SPL rather than the electrical signal level delivered to the headset receiver as the basis for SPL and delta limiting. Such use of the true SPL (or estimated true SPL) helps to ensure that the delta limiting and SPL limiting both occur at precisely defined sound pressure levels rather than at arbitrary electrical signal levels.

The SPL incident detector 54 receives the (estimated) true SPL waveform and measures the mean square sound pressure level to detect for an SPL incident. The SPL limiter 56 calculates the SPL gain reduction depending on the results of the SPL incident detection so as to limit the sound pressure level below a predetermined SPL threshold. The SPL gain reduction $Gain_{SPL}$ is then applied by the VGA 64 or a digital gain-control block (not shown) that performs the same function as the VGA in the digital domain.

The delta detector 58 detects acoustic incidents that have a high likelihood of causing acoustic startle in the user, based on the rise time and amount of increase in the sound pressure level. For example, delta incident detector 58 may base its determination on whether the combination of the increase in the sound level, suddenness of the increase in the sound level, and the absolute sound level is likely to cause acoustic startle in the user. If acoustic startle is determined to be likely, the delta limiter 60 then generates a time-varying control signal for the VGA 64 to slow the rise time of the increase in the sound pressure level. The time-varying gain control of the delta limiter 60 may use a feedforward configuration as will be described in more detail below. The combination of the delta detector 58 and the delta limiter 60 thus facilitates in preventing acoustic startle in the user, i.e., the anti-startle feature.

The combination and close integration of the true SPL processing 52, SPL limiting, and anti-startle processing in the audio processing system 50 allows the SPL limiter 56 to use a relatively slow attack time constant so that normal speech peaks remains relatively unaffected while the combination of delta limiter 60 and SPL limiter 56 still provides instantaneous limiting of loud, fast-onset noises. The look-ahead delay element 62 applies a short look-ahead delay, typically a few milliseconds, to ensure that gain reductions Gain$_{SPL}$ and Gain$_{delta}$ are applied slightly before they are actually needed so as to prevent any loud glitches occurring as the VGA 64 responds to increases in signal level. Each component of the audio processing system 50 will now be described in more detail below.

As noted, the audio processing system 50 uses the true SPL instead of electrical signal level as the basis for SPL and delta limiting. True SPL processing enables consistent limiting at the same sound level regardless of changes in the signal spectrum or audio transducer. Such consistent limiting at the same sound level is particularly applicable to headsets, handsets, etc. that are used in a fixed position close to the ear and thus have relatively consistent receiving characteristics. However, true SPL processing may also be used by audio processing systems in applications with loudspeaker systems in a controlled acoustic environment, for example. True SPL is measured at a chosen datum point such as at an eardrum reference point (DRP), ear reference point (ERP) or equivalent open-field sound pressure level. In some applications the true SPL may be directly measured using a microphone located at, or close to, the chosen datum point. For example, a microphone mounted in the headset receiver assembly may directly measure the SPL at ERP. If it is difficult or impossible to directly measure the SPL at the chosen datum point, the true SPL may be estimated based on a measurement made at a different point. For example the SPL at DRP may be estimated from the SPL at ERP by passing the output signal from a probe microphone located at ERP through a filter whose frequency response is equal to the ERP-to-DRP transfer function of a typical human ear.

Although the true SPL may be measured with a probe microphone located at or close to the datum point in some applications, in many cases, such direct measurement of the true SPL may be impractical or difficult. Thus, the audio processing system 50 typically employs the true SPL processor 52 to estimate or calculate the true SPL from the electrical signal level. For example, if the chosen datum is A-weighted SPL at the DRP, the headset's receiving frequency response (reference DRP) can be measured and combined with an A-weighting response to form a composite true SPL estimation filter. In a digital system, the true SPL estimation filter may also include DAC gain and power amplifier gain as a function of frequency. The transfer function for the true SPL estimation filter can be a combination of the headset's receiving frequency response with the DAC and power amplifier frequency response and the A-weighting response. The true SPL estimation filter models the electroacoustic transmission path between the SPL limiting device and the user's eardrum or other chosen datum point. The true SPL estimation filter processes the digital signal driving the DAC to estimate the A-weighted sound pressure waveform that is present at the user's eardrum, from which the A-weighted SPL may be calculated.

Figure 2:
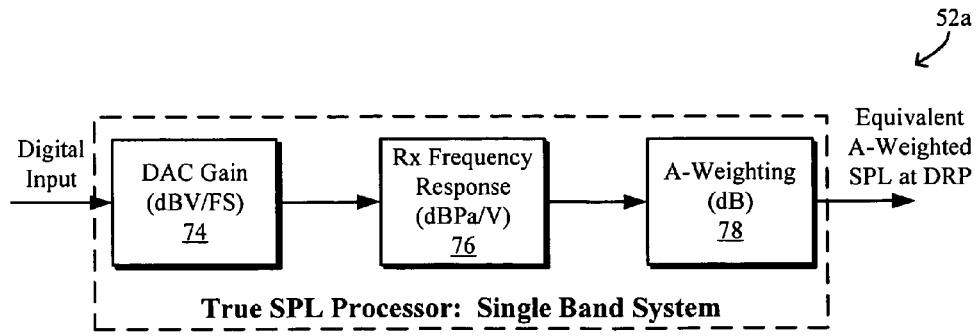
FIG. 2 is a block diagram illustrating an exemplary true-SPL converter employing single band processing.
Figure 3:
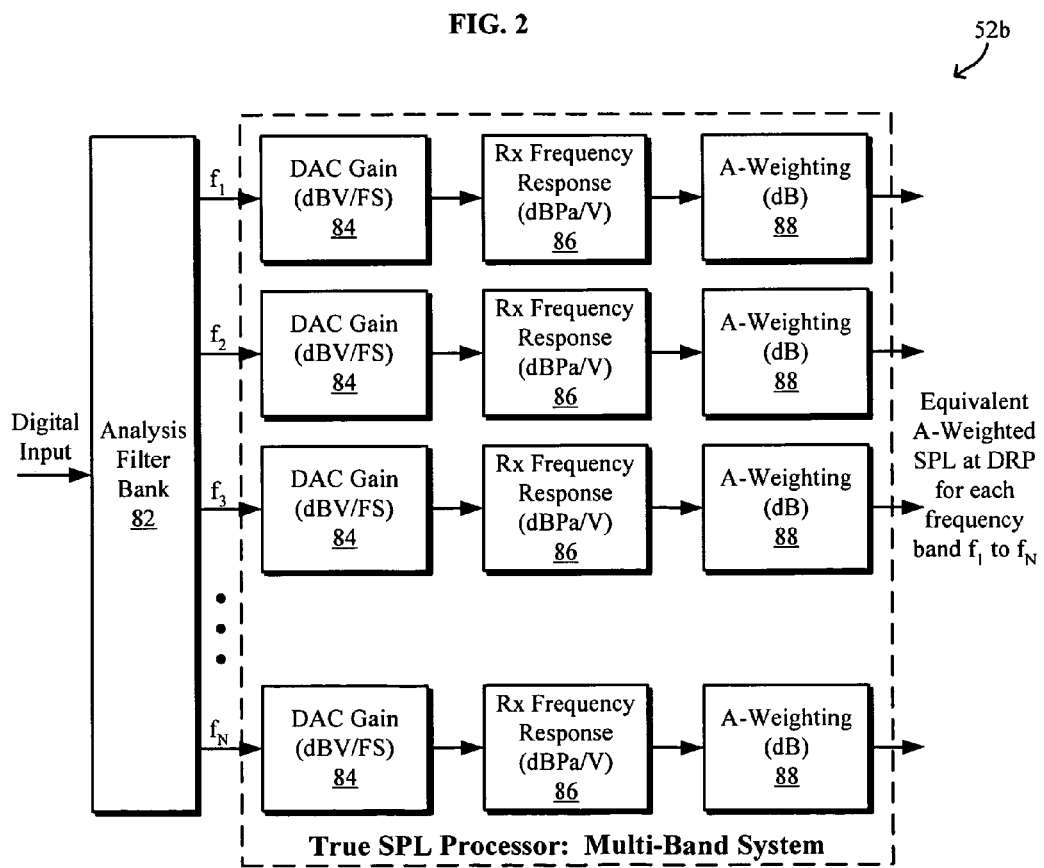
FIG. 3 is a block diagram illustrating an alternative exemplary true-SPL converter employing multi-band processing.

FIGS. 2 and 3 are block diagrams illustrating exemplary true SPL estimators 52*a*, 52*b* employing single band processing and multi-band processing, respectively. The single band true SPL estimator 52*a* as shown in FIG. 2 implements an electrical or digital filter whose transfer function is equivalent to a combination of the DAC and power amplifier gain 74, headset frequency response 76 and A-weighting frequency response 78. The multi-band true SPL estimator 52*b* as shown in FIG. 3 uses a separate gain value for each frequency band, which is equivalent to a combination of the average DAC and power amplifier gain 84, headset receiving sensitivity 86 and A-weighting value 88 in that frequency band. As the true SPL estimator or estimation filter 52*a*, 52*b* is generally employed in a digital system, the true SPL estimator 52*a*, 52*b* may include the DAC and power amplifier gain 74, 84. Alternatively, if the true SPL estimator 52*a*, 52*b* is employed in an analog system, there would be no DAC frequency response term although a power amplifier frequency response may still be included. In other words, the true SPL estimation filter 52 processes the digital signal driving the DAC, or the electrical signal driving the headset's receiver, to estimate the A-weighted SPL that is present at the wearer's eardrum or other chosen datum point.

With single band (time domain) processing as shown in FIG. 2, the estimator 52 can implement frequency-weighted SPL measurement and limiting but cannot distinguish between narrowband and wideband signals of the same power. In contrast, with multi-band (frequency domain) processing as shown in FIG. 3, the electrical signal is split into multiple frequency bands $f_1, f_2, f_3, \ldots, f_n$, using an analysis filter bank 82 or block transform. With both single band and multi-band processing, frequency-weighted limiting may be implemented by replacing the A-weighting frequency response 78, 88 with the alternative frequency response that is required. Multi-band processing 52*b* allows independent narrowband and whole band SPL measurements. For example, multi-band processing 52*b* can be configured to limit high frequency narrowband signals to a lower level than single band processing, if both systems are configured to limit the whole-band SPL to the same level, for example.

It is noted that the accuracy of SPL limiting depends on the accuracy of the SPL measurement. When SPL is estimated from the electrical signal driving the headset or loudspeaker, one factor affecting the accuracy of the SPL measurement is the accuracy with which the receiving frequency response of the transducer is known. Very accurate SPL calculation may be achieved if the receiving frequency response for the specific headset in use has been measured. Less accurate SPL calculation may be achieved if an average frequency response for the headset type or model is used. An even less accurate SPL calculation results if a generic average frequency response for several headset models is used.

Figure 4:
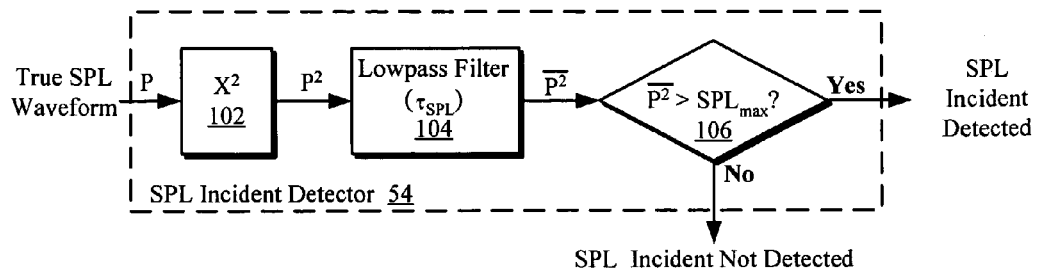
FIG. 4 is a block diagram illustrating an exemplary SPL incident detector.

The true SPL processor 52 outputs an estimated true SPL waveform P to both the SPL incident detector 54 and the delta incident detector 58. The estimated true SPL waveform P is a waveform whose instantaneous level represents the sound pressure (e.g. Pascals, A-weighted) at the selected acoustic reference point, e.g., at the DRP. The SPL incident detector 54 detects when the SPL exceeds a predetermined SPL threshold $SPL_{max}$. FIG. 4 is a block diagram illustrating an exemplary SPL incident detector 54 for an audio processing system that uses single-band true SPL processing. The SPL incident detector 54 includes a squarer $X^2$ 102, a lowpass filter 104 with an associated time constant $\tau_{SPL}$ and a comparator 106. In particular, the SPL incident detector 54 determines and compares the mean square sound level $\overline{P^2}$ with the predetermined SPL threshold $SPL_{max}$. In one embodiment, the time constant $\tau_{SPL}$ is approximately 20 ms and the predetermined SPL threshold $SPL_{max}$ is approximately 100 dB (A).

The lowpass filter 104 may be a first-order infinite impulse response (IIR) filter implementing: $y_n A y_{n-1} + (1-A) x_{n-1}$, where:

$$A = \exp\left(\frac{-1}{\tau_{SPL} f_s}\right),$$

$f_s$ is the sampling frequency, which is typically 8 kHz or 16 kHz for a telecommunications device but may be any other suitable frequency.

$x_n$ is the filter input ($n^{th}$ sample in the time series), and $y_n$ is the filter output ($n^{th}$ sample in the time series).

An SPL incident detector 54 for an audio processing system using multi-band true SPL processing would employ a narrowband SPL incident detector 54 similar to that shown in FIG. 4 for each frequency band. A whole band SPL incident detector may also be implemented using the mean square sum of the sub-band signal levels. The narrowband SPL limiting thresholds are typically lower than the whole band SPL limiting threshold and may vary with frequency.

The output of the SPL incident detector 54 drives the SPL limiter 56 which in turn reduces the SPL generated in the headset when SPL incidents are detected by controlling the gain of the VGA. In one exemplary implementation, the SPL limiter 56 may apply a fixed attenuation $A_{SPL}$, e.g., 40 dB, with attack time $t_{SPL\_attack}$ and release time $t_{SPL\_release}$. A fixed attenuation $A_{SPL}$ of approximately 40 dB is generally sufficient to reduce the loudest sounds that can occur on a telephone network to a comfortable level at or below normal speech level while still allowing the user to detect that an acoustic incident has occurred. In one example, a fixed attenuation of approximately 40 dB with a SPL limiting threshold $SPL_{max}$ of 100 dB (A) reduces such signals to a minimum level of 60 dB (A), which is clearly audible in most situations. Although a particular implementation is described, the SPL limiter 56 may be implemented in various other suitable ways. Merely as an example, rather than applying a fixed 40 dB attenuation, the SPL limiter 56 may apply an attenuation equal to the amount by which the input signal exceeds the SPL incident threshold. As is evident, various other implementations of the SPL limiter 56 may be employed to reduce the SPL below the SPL incident threshold.

Attack and release may have logarithmic rather than linear or exponential characteristics as a human listener tends to perceives logarithmic attacks and releases as smooth linear changes of loudness. In one embodiment, the attack time $t_{SPL\_attack}$ is approximately 50 ms and the release time $t_{SPL\_release}$ is approximately 250 ms. A non-instantaneous attack time $t_{SPL\_attack}$ ensures that the natural peaks of speech are generally unaffected even when listening to loud speech with an rms signal level close to the limiting threshold $SPL_{max}$ such that the SPL incident detector is triggered for a few milliseconds by peaks of the speech waveform. A slow release time $t_{SPL\_release}$ facilitates in preventing the resulting 40 dB rise in signal level from causing acoustic startle.

Figure 5:
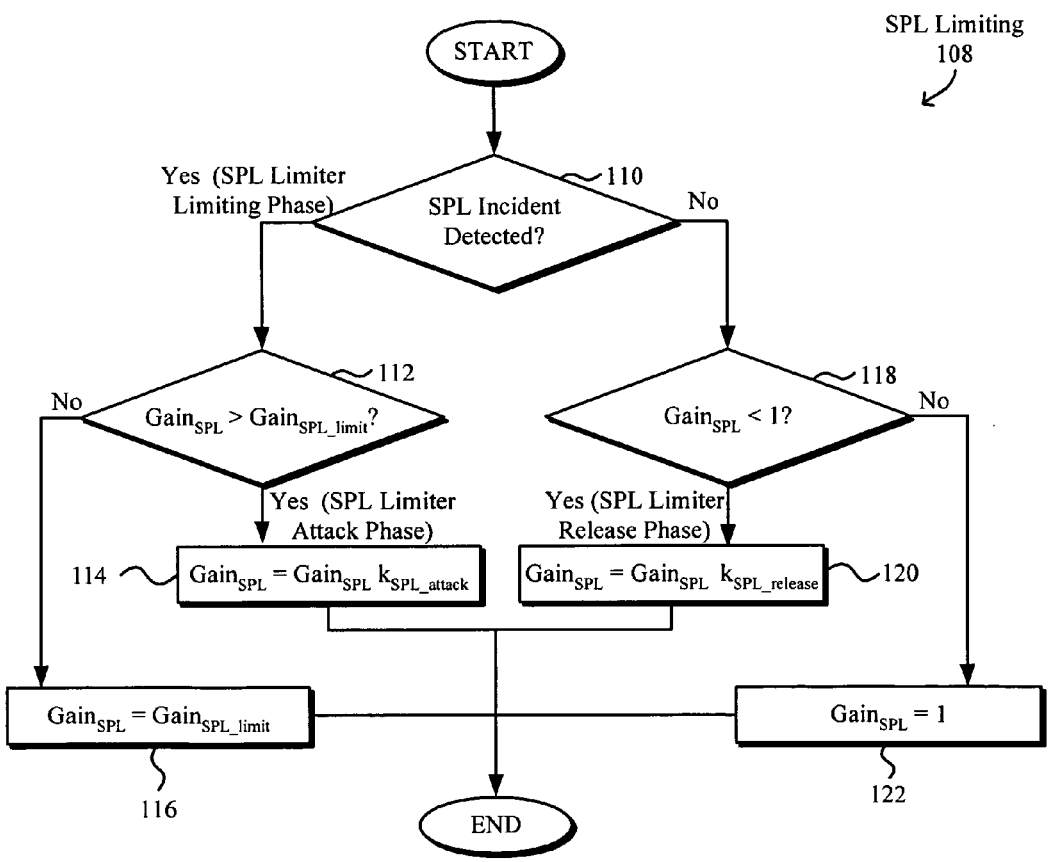
FIG. 5 is a flowchart illustrating an exemplary process for limiting the sound pressure level.

FIG. 5 is a flowchart illustrating an exemplary SPL limiting process 108 for limiting the sound pressure level as performed by the SPL limiter 56. The SPL limiting process 108 shown is performed by the SPL limiter 56 for each new audio sample. In particular, if an SPL incident is detected as determined at decision block 110, the SPL limiter enters a limiting phase. In the limiting phase, the SPL limiter determines whether the SPL gain $Gain_{SPL}$ exceeds a predetermined SPL gain limit $Gain_{SPL\_limit}$ at decision block 112. If so, then the SPL limiter enters an attack phase at block 114 and sets the SPL gain $Gain_{SPL}$ to:

$$Gain_{SPL} = Gain_{SPL} k_{SPL\_attack}$$

where $k_{SPL\_attack}$ is the SPL attack constant:

$$k_{SPL\_attack} = 10^{\left[\frac{\log(Gain_{SPL\_limit})}{f_s t_{SPL\_attack}}\right]}$$

and $f_s$ is the sampling frequency (Hz).

While the acoustic processing system remains in the active attack phase, each iteration of the SPL limiting process 108 decreases the SPL gain $Gain_{SPL}$ until it reaches the predetermined SPL gain limit $Gain_{SPL\_limit}$. Once the SPL gain $Gain_{SPL}$ has reached the predetermined SPL gain limit $Gain_{SPL\_limit}$, i.e., the SPL gain $Gain_{SPL}$ is equal to or less than the predetermined SPL gain limit $Gain_{SPL\_limit}$ as determined at decision block 112, the SPL gain $Gain_{SPL}$ is set to equal to the predetermined SPL gain limit $Gain_{SPL\_limit}$ at block 116, i.e., steady state attenuation by the SPL limiter.

If an SPL incident is not detected as determined at decision block 110, the SPL limiter determines whether the SPL gain $Gain_{SPL}$ is less than unity (1) at decision block 118. If so, the SPL limiter is in a release phase and, at block 120, the SPL limiter increases the SPL gain $Gain_{SPL}$ to:

$$Gain_{SPL} = Gain_{SPL} k_{SPL\_release},$$

where $k_{SPL\_release}$ is the SPL release constant:

$$k_{SPL\_release} = 10^{\left[\frac{-\log(Gain_{SPL\_limit})}{f_s t_{SPL\_release}}\right]}.$$

While the acoustic processing system remains in the release phase, each iteration of the SPL limiting process 108 increases the SPL gain $Gain_{SPL}$ until it reaches unity (1), i.e., the release phase is complete and no attenuation is applied by the SPL limiter. Once the SPL gain $Gain_{SPL}$ has reached or exceeded unity, as determined at decision block 118, the SPL gain $Gain_{SPL}$ is set to equal to unity (1) at block 122, i.e., no attenuation is applied by the SPL limiter. In one embodiment, the attack time $t_{SPL\_attack}$ is approximately 50 ms, the release time $t_{SPL\_release}$ is approximately 250 ms, and the SPL gain limit $Gain_{SPL\_limit}$ is approximately 0.01, i.e. 40 dB attenuation.

In addition to SPL limiting, the audio processing system 50 also provides an anti-startle feature by implementing the delta detector 58 for detecting changes in the sound level that are deemed to be likely to cause acoustic startle and the delta limiter 60 for limiting such changes in the sound level. As acoustic startle is a complex and widely variable phenomenon that depends on a range of environmental and psychological conditions, acoustic startle is generally not amenable to simple characterization. For example, acoustic startle is typically not characterized by defining specific limits for absolute increases in SPL and/or rate of increases in the sound level that cause a startle response. However, some observations affecting the likelihood and/or intensity of acoustic startle typically include faster rising acoustic stimuli increase the intensity of an acoustic startle, larger increases in sound level increase both the likelihood and intensity of acoustic startle, and under some conditions, sound levels as low as 60 dB SPL are capable of causing acoustic startle. Thus sound level increase and the rise time of that increase may be used to form the basis of an acoustic startle detection algorithm implemented by the delta incident detector 58 whose parameters can be tuned empirically to suit particular operating environments.

Figure 6:
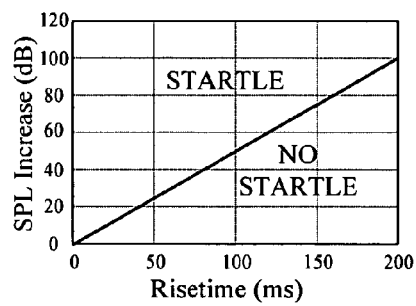
FIG. 6 is a graph illustrating an exemplary anti-startle boundary in a SPL increase vs. rise time variable space.

FIG. 6 is a graph illustrating an exemplary anti-startle boundary defined in an SPL increase versus rise time variable space. The upper left portion above the anti-startle boundary in the variable space, representing large increases in SPL with relatively fast rise times, generally corresponds to high probability and likely intensity of acoustic startle. The lower right portion below the anti-startle boundary in the variable space, representing small increases in SPL with relatively slow rise times, generally corresponds to low probability and likely intensity of acoustic startle. The anti-startle boundary is such that above the boundary, the probability and likely intensity of acoustic startle is deemed to be unacceptable. As shown, longer rise time signals require a greater total sound level increase to cause acoustic startle than fast rise time signals. The actual gradient of the delta detector boundary may be determined empirically, for example.

Figure 7:
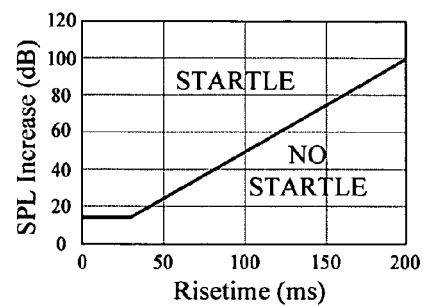
FIG. 7 is a graph illustrating the anti-startle boundary in the SPL increase versus rise time variable space of FIG. 6 with a minimum delta requirement introduced.

However, small increases, i.e., delta, in sound level generally do not cause acoustic startle regardless of the rise time. In one embodiment, the approximate minimum delta that may cause acoustic startle is approximately 15 dB. FIG. 7 is a graph illustrating the anti-startle boundary in the SPL increase versus rise time variable space of FIG. 6 with the minimum delta requirement introduced. It is noted that various alternative values for the minimum delta may be used and may be fine tuned by subjective testing.

The delta incident detector 58 may detect delta incidents based on the anti-startle boundary as shown in FIG. 7. In addition, the delta incident detector 58 may also take into account that the resumption of speech at the previous sound level after a short period of silence is unlikely to cause acoustic startle even if such resumption results in a very large increase in sound level relative to the preceding silence. Thus the additional condition for the delta incident detector 58 to be triggered is that the instantaneous sound level exceeds the previous active speech level by a certain resumption of speech threshold. During active speech, the resumption of speech threshold may be slightly greater than the speech crest factor while during periods of silence, the resumption of speech threshold may decay exponentially with a time constant. The resumption of speech time constant may be on the order of seconds or tens of seconds, for example.

Figure 8:
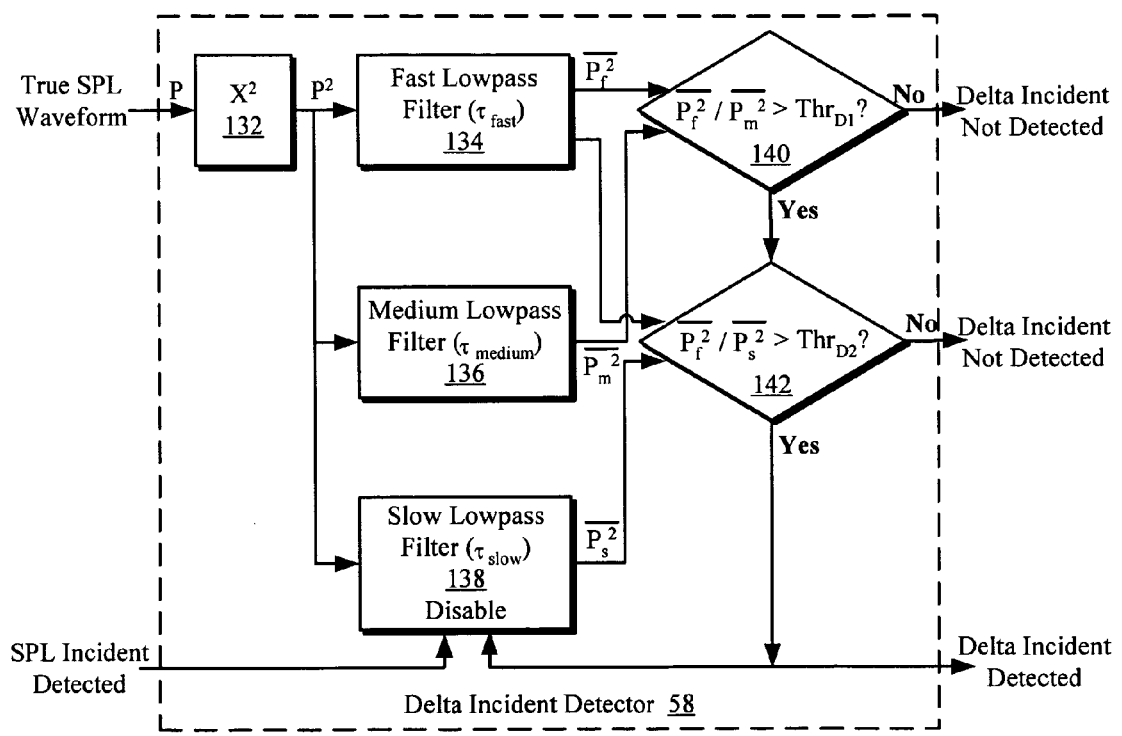
FIG. 8 is a block diagram illustrating an exemplary delta incident detector.

FIG. 8 is a block diagram illustrating an exemplary delta incident detector 58. As shown, the delta incident detector 58 receives the estimated true SPL waveform P output from the true SPL processor 52. The delta incident detector 58 detects delta incidents that are likely to cause acoustic startle. The delta incident detector 58 includes a squarer $X^2$ 132, fast, medium and slow lowpass filters 134, 136, 138 with associated time constants $\tau_{Delta\_fast}$, $\tau_{Delta\_medium}$, $\tau_{Delta\_slow}$, respectively, and delta detection threshold comparators 140, 142. Each of the lowpass filters 134, 136, 148 may be a first order IIR filter similar to that used in the SPL incident detector 54 as described above with reference to FIG. 4. In one embodiment, the time constants $\tau_{fast}$, $\tau_{medium}$, $\tau_{slow}$ for the lowpass filters 134, 136, 138 are approximately 5 ms, 50 ms, and 5 s, respectively.

The slow lowpass filter 138 measures the recent average speech level and may be selectively enabled and disabled. Specifically, when either an SPL incident or a delta incident is detected, the slow lowpass filter 138 is disabled such that the slow lowpass filter 138 does not perform filter update calculations and the current filter output state is frozen and used until the slow lowpass filter 138 is re-enabled. Such a configuration helps to prevent abnormal signal levels during acoustic incidents from affecting the average speech level estimation. However, the slow exponential decay with time constant $\tau_{slow}$ ensures that normal speech (or other audio) starting after a long period of silence is correctly flagged as a potentially startling incident.

The first delta detection threshold comparator 140 compares the ratio of the mean square sound levels $\overline{P_f^2}/\overline{P_m^2}$ output from the fast and medium lowpass filters 134, 136 to a first (fast/medium) predetermined delta detection threshold $Thr_{D1}$. The second delta detection threshold comparator 142 compares the ratio of the mean square sound levels $\overline{P_f^2}/\overline{P_s^2}$ output from the fast and slow lowpass filter 134, 138 with a second (fast/slow) predetermined delta detection threshold $Thr_{D2}$. In one embodiment, the predetermined first (fast/medium) and second (fast/slow) delta detection thresholds $Thr_{D1}$ and $Thr_{D2}$ are 5.6 (7.5 dB) and 31.6 (15 dB), respectively.

Figure 9:
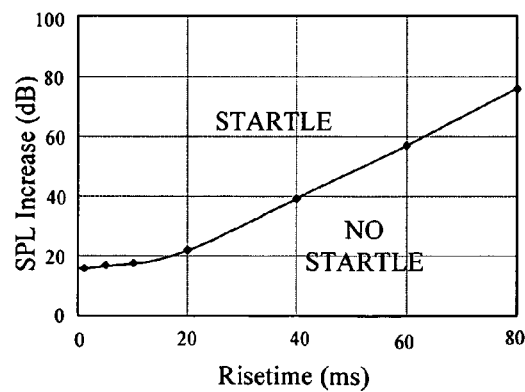
FIG. 9 is a graph illustrating a delta detector response measured using the exemplary delta incident detector of FIG. 8.

The first delta detection threshold comparator 140 implements the anti-startle boundary such as that shown in FIG. 7. Thus if the first comparator 140 determines that the first delta threshold $Thr_{D1}$ is not exceeded, then a delta incident is not detected. On the other hand, if the first delta threshold is exceeded, i.e., the anti-startle boundary is crossed, the second comparator 142 ensures that resumption of speech (or other audio) at or close to the previous sound level after a short pause does not trigger delta (startle) incidents. FIG. 9 is a graph illustrating an exemplary measured response of the delta incident detector 58 for the exemplary time constant and threshold values presented herein. The minimum delta plateau level, the knee-point and the slope are all configurable by changing the filter time constants and/or the first delta detection thresholds $Thr_{D1}$.

When the delta incident detector detects a delta incident, the delta incident detector 58 triggers the delta limiter 60. In one exemplary implementation, when triggered, the delta limiter 60 applies a fixed attenuation with an instantaneous (or near instantaneous) attack and a slow release. The slow release may be logarithmic to ensure that the release sounds gradual to a human listener. Such delta limit processing slows the rise time of signals with fast rise times, thus reducing the likelihood of acoustic startle. In one embodiment, the delta limiter 60 may have an attack time of approximately $1000/f_s$ ms or less (where $f_s$ is the sampling frequency), a release time $t_{delta\_release}$ of approximately 250 ms, and an initial attenuation of approximately 40 dB, i.e., delta gain limit $Gain_{delta\_limit}$ of 0.01. Various other suitable implementations of the delta limiter 60 may be similarly employed to slow the rise time of signals with fast rise times.

Figure 10:
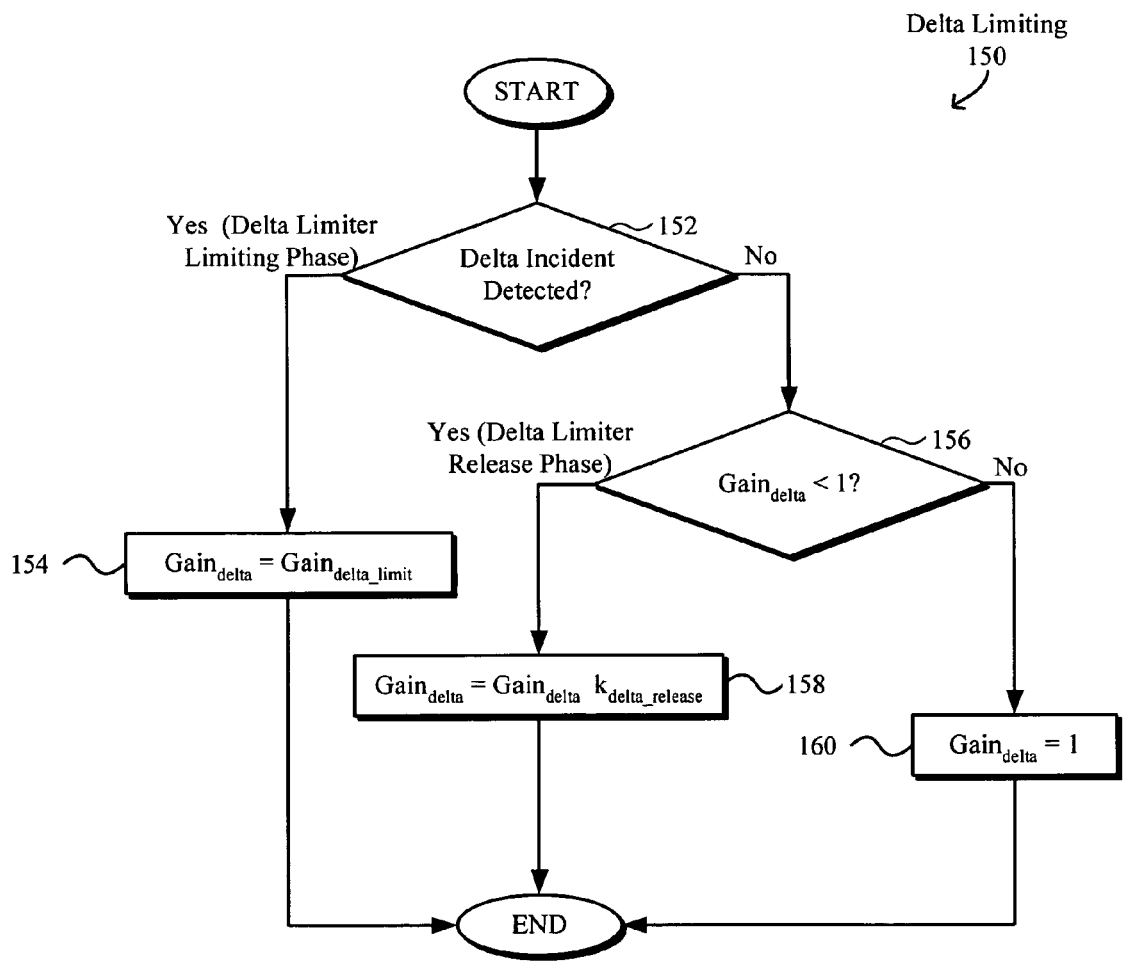
FIG. 10 is a flowchart illustrating an exemplary process for limiting the delta value.

FIG. 10 is a flowchart illustrating an exemplary process 150 for slowing the rise time as performed by the delta limiter 60. The delta limiting process 150 shown is performed by the delta limiter 60 for each new audio sample. At decision block 152, the delta limiter determines if the delta incident detector has detected a delta incident. If so, the delta gain $Gain_{delta}$ is immediately set to the delta gain limit $Gain_{delta\_limit}$ at block 154 so that the attack time of the attenuation applied by the delta limiter is instantaneous or near instantaneous. In general, any delay in applying the attenuation by the delta limiter is introduced by the short processing delays attributable to the true SPL processor, the delta detector and the fact that the output of a digital audio system is sampled and thus only changes once every ($1/f_s$) seconds. This sampling may delay a change in the system output, in response to a change in the input signal, by up to ($1000/f_s$) milliseconds. Alternatively, if the delta incident detector has not detected a delta incident, the delta limiter determines if the delta gain $Gain_{delta}$ is less than unity (1) at decision block 156. If so, the delta limiter is in a delta release phase and, at block 158, the delta gain $Gain_{delta}$ is increased to:

$$Gain_{delta} = Gain_{delta} k_{delta\_release},$$

where $k_{delta\_release}$ is the delta release constant:

$$k_{delta\_release} = 10^{\left[\frac{-\log(Gain_{delta\_limit})}{f_s t_{delta\_release}}\right]},$$

and $f_s$ is the sampling frequency (Hz).

While the acoustic processing system remains in the delta release phase, each iteration of the delta limiting process 150 increases the delta gain $Gain_{delta}$ until it reaches unity (1), i.e., no attenuation. Once the delta gain $Gain_{delta}$ has reached or exceeded unity (1) as determined at decision block 156, the delta gain $Gain_{delta}$ is set to unity (1) at block 160, i.e., no attenuation applied by the delta limiter.

Some of the parameters and their respective values or equations used by the exemplary SPL and delta limiters 56, 60 presented herein are summarized in Table 1 below. However, various other suitable parameter values may be similarly employed to achieve different characteristics of SPL limiting and/or delta limiting. It is noted that although the exemplary SPL limiter 56 and the delta limiter 60 apply the same gain limit, the same release time, and uses the same release constant determination, the SPL and delta limiters 56, 60 may be configured with parameter values different from each other. In addition, although not shown in TABLE 1, other suitable parameter values different from the exemplary values presented herein for the true SPL processor 52 and the SPL and delta incident detectors 54, 58 may be employed.

the acoustic processing system where the input has a fast risetime tone burst at time t=10 sec. Note that the input level graphs use different vertical scales and the input signal level in FIG. 12 is approximately ten times greater than the input signal level in FIG. 11. Also note that in FIG. 12, the output level graph uses a different vertical scale from that used for the input level graph. If the output and input level graphs used the same vertical scale, the details on the output level graph would not be visible due to the 80 dB (10,000 times) attenuation provided by the combination of the SPL limiter and the delta limiter.

Figure 11:
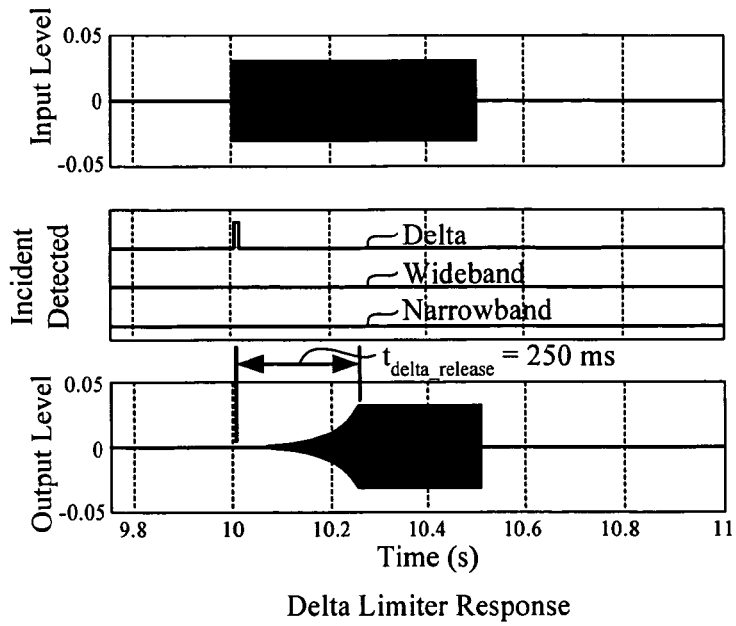
FIG. 11 are graphs illustrating an exemplary measured delta limiter response.
Figure 12:
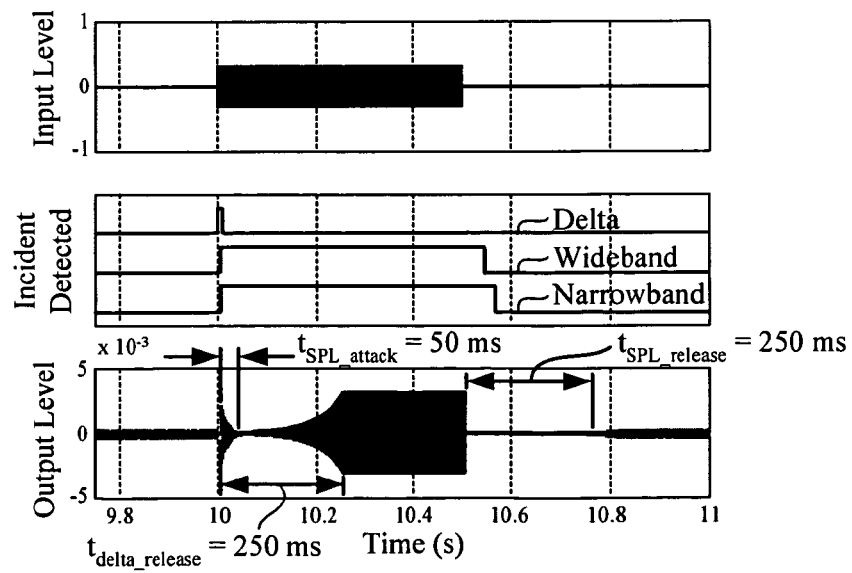
FIG. 12 are graphs illustrating an exemplary combined SPL and delta limiter response.

In FIG. 11, the sudden increase in input level causes a delta incident, but the absolute SPL is too low to cause either whole-band or narrowband SPL incidents. As shown, when the delta incident detector detects the delta incident at t=10 sec and triggers the delta limiter, the delta limiter (nearly) instantaneously applies the delta gain limit $Gain_{delta\_limit}$, e.g., 0.01 or 40 dB attenuation. The delta limiter then enters its release phase with a slow release (rise) time $t_{delta\_release}$ of 250 ms and increases the delta gain $Gain_{delta}$ until it reaches unity (1), i.e., no attenuation, at time t=10.25 sec. At time t=10.25 sec, the delta limiter has completed its release phase and no longer applies any attenuation so that the input and output electrical signal levels are equal.

In FIG. 12, the combined SPL and delta limiter response is shown for an input signal, approximately ten times greater than that shown in FIG. 11, which causes the delta incident detector, the whole-band SPL incident detector and the narrowband incident detectors all to be triggered. Note the input and output level graphs have different vertical scales because the output is heavily attenuated by the SPL limiter and the delta limiter for the duration of the acoustic incident.

As shown, when the delta incident detector detects the acoustic incident at t=10 sec, the delta incident detector triggers the delta limiter to apply 40 dB of attenuation nearly instantaneously. The delta limiter provides instantaneous or near instantaneous attenuation and then enters its release phase with a slow release (rise) time such that the delta-limited output signal has a slow rise time.

The SPL incident detector detects the same acoustic incident shortly after the delta incident detector and causes the SPL limiter to apply an additional 40 dB of attenuation with a relatively slow attack time $t_{SPL\_attack}$ of 50 ms. The SPL

TABLE 1

| Parameter | SPL Limiter | Delta Limiter |
|---|---|---|
| Attack Time | 50 ms | <$1000/f_s$ ms (near instantaneous) |
| Release Time | 250 ms | 250 ms |
| Limit | 0.01 (40 dB attenuation) | 0.01 (40 dB attenuation) |
| Gain | when steady state attenuation reached | initial attenuation |
| Attack Constant | $k_{SPL\_attack} = 10^{\left[\frac{\log(Gain_{SPL\_limit})}{f_s t_{SPL\_attack}}\right]}$ | Not Applicable |
| Release Constant | $k_{SPL\_release} = 10^{\left[\frac{-\log(Gain_{SPL\_limit})}{f_s t_{SPL\_release}}\right]}$ | $k_{delta\_release} = 10^{\left[\frac{-\log(Gain_{delta\_limit})}{f_s t_{delta\_release}}\right]}$ |

FIG. 11 are graphs illustrating an exemplary measured delta limiter response and FIG. 12 are graphs illustrating an exemplary combined SPL and delta limiter response. These graphs represent the response from a multi-band test system employing a delta incident detector, a whole band SPL incident detector, and 16 narrowband SPL incident detectors, the activities of which are shown in the center graph. The top and bottom graphs show the electrical input and output signals of incident detector is delayed relative to the delta incident detector due in part to the longer time constant used by the SPL incident detector (20 ms for the SPL incident detector versus 5 ms for the delta incident detector), and also due in part to the SPL detector's internal signal level having to slew all the way from its initial low value to approximately 100 dB SPL before an SPL incident is flagged. In contrast, a delta incident can be triggered by a relatively small increase in SPL, e.g., on the order of 15 dB. At approximately 50 ms after the acoustic incident (t=10.05 sec), the cumulative attenuation peaks at approximately 80 dB with the delta and SPL limiters each contributing approximately 40 dB attenuation. At this point, the SPL limiter applies its 40 dB of steady state attenuation (Gain$_{SPL\_limit}$ of 0.01) for the entire duration of the SPL incident until both the whole-band and narrowband SPL incident detectors become inactive at t=10.56 sec. The SPL detectors may remain active slightly longer than the input signal remains above their respective SPL incident thresholds due to the decay characteristics of the lowpass filters used in the SPL detectors. The delta limiter, on the other hand, continues its release phase with a release time t$_{delta\_release}$ of 250 ms until its release phase is complete at t=10.25 sec. Thus, from the peak cumulative attenuation of approximately 80 dB at t=10.05 sec, the cumulative attenuation reduces to approximately 40 dB by time t=10.25 sec or about 250 ms after the start of the acoustic incident when the delta limiter completes its release phase.

After the SPL incident detectors become inactive at t=10.56 sec, the SPL limiter then enters its release phase with a with a slow release (rise) time t$_{SPL\_release}$ of 250 ms as it decreases its attenuation from 40 dB to 0 dB.

Because the delta limiter provides (near) instantaneous limiting, the SPL limiter can use a relatively slow attack time so as to prevent the SPL limiter from clipping normal peaks of the speech waveform, even at rms speech levels close to the limiting threshold, which may result in short-term peaks in the speech waveform causing the threshold to be exceeded for a few milliseconds. The delta incident detector may be tuned so as to not trigger during continuous speech with short periods of silence. The net effect of the SPL and delta incident detectors and limiters is that loud and/or potentially startling acoustic incidents are avoided but undesirable distortion of speech (or other audio) is reduced or minimized. The combination of the delta and SPL limiters complement each other so as to provide better acoustic comfort and less degradation of speech signals.

Referring again to FIG. 1, the combination of the true SPL processor 52, detectors 54, 58, and limiters 56, 60 introduces a short delay. Thus the look-ahead delay element 62 is provided in the signal path so that the gain control applied by the variable gain amplifier (VGA) 64 is applied slightly before the acoustic incident that requires attenuation, thus preventing short duration glitches on the system output when acoustic incidents occur on the input. The delay introduced by the delay element 62 may be slightly longer than the delay in the VGA control path to ensure the prevention of such glitches on the system output. Typically, the processing performed by the components of the audio processing system 50 is carried out in the digital domain so that the VGA 64 is a digital gain block whose gain Gain$_{VGA}$ is the product of the delta limiter gain Gain$_{delta}$ and the SPL limiter gain Gain$_{SPL}$.

The audio processing system 50 provides several features including improved accuracy of SPL at which limiting occurs with the use of the true SPL processor 52, an anti-startle feature with the use of the delta incident detector and limiter 58, 60 by instantaneously limiting acoustic incidents with fast risetime and high intensity, and reduced distortion of speech (or other audio) whose rms level is close to the limiting threshold with the combination of the SPL and delta incident detectors and limiters. The audio processing system 50 thus provides better acoustic comfort and less degradation of speech signals.

While the exemplary embodiments of the present invention are described and illustrated herein, it will be appreciated that they are merely illustrative and that modifications can be made to these embodiments without departing from the spirit and scope of the invention. Thus, the scope of the invention is intended to be defined only in terms of the following claims as may be amended, with each claim being expressly incorporated into this Description of Specific Embodiments as an embodiment of the invention.

What is claimed is:

1. An audio processing system, the system receiving input signals, comprising:
   a delta incident detector configured to detect delta acoustic incidents in the input signals that exceed a predetermined acoustic startle boundary;
   a delta limiter configured to determine an anti-startle gain in response to the delta incident detector detecting a delta acoustic incident, the anti-startle gain having an anti-startle gain limit and an anti-startle release time associated therewith;
   an amplifier configured to apply the anti-startle gain to the input signal;
   wherein the delta incident detector includes:
   a fast lowpass filter associated with a short time constant and configured to generate mean square sound levels associated with the short time constant from input signals;
   a medium lowpass filter associated with a medium time constant that is larger than the short time constant and configured to generate mean square sound levels associated with the medium time constant from input signals;
   a first comparator that compares a ratio between the mean square sound level outputs from the fast and medium lowpass filters to a first predetermined delta incident detection threshold to determine whether the input signals exceed the predetermined acoustic startle boundary;
   a slow lowpass filter associated with a long time constant that is larger than the medium time constant and configured to generate mean square sound levels associated with the long time constant from the input signals, the slow lowpass filter facilitates in measuring a recent average signal level and is further configured to be selectively enabled and disabled; and
   a second comparator that compares a ratio between the mean square sound level outputs from the fast and slow lowpass filters to a second predetermined delta incident detection threshold, the second comparator facilitates in preventing false triggering of the delta incident detector during normal speech.

2. An audio signal processing system, the system receiving input signals, comprising:
   a true sound pressure level (SPL) processor configured to estimate true SPL delivered by a transducer at a predetermined datum point from the input signals;
   an acoustic incident detector configured to detect acoustic incidents based on the estimated true SPL and on a predetermined acoustic incident threshold;
   an acoustic incident limiter configured to determine an acoustic incident gain in response to the acoustic incident detector detecting an acoustic incident; and
   an amplifier configured to apply the acoustic incident gain to the input signal.

3. The system of claim 2, wherein the true SPL processor employs single band, time domain processing that implements frequency-weighted SPL measurement.

4. The system of claim 2, wherein the true SPL processor employs multi-band, frequency domain processing that applies a corresponding filter weight to each frequency band and implements a separate narrowband SPL measurement in each frequency band and a whole-band SPL measurement including the mean-square sum of the narrowband SPL measurements.

5. The system of claim 2, wherein the true SPL processor is based on a measured receiving frequency response of the transducer.

6. The system of claim 2, wherein:
the acoustic incident detector is a delta incident detector configured to detect delta acoustic incidents in the input signals that exceed a predetermined acoustic startle boundary, and
the acoustic incident limiter is a delta limiter configured to determine an anti-startle gain in response to the delta incident detector detecting a delta acoustic incident, the anti-startle gain having an anti-startle gain limit and an anti-startle release time associated therewith, the amplifier being configured to apply the anti-startle gain to the input signal.

7. The system of claim 6, wherein, upon detection of the delta acoustic incident by the delta incident detector, the delta limiter reduces the anti-startle gain to the anti-startle gain limit and then enters a delta limiter release phase in which the delta limiter increases the anti-startle gain over a period of time associated with the anti-startle release time until the anti-startle gain reaches unity (1).

8. The system of claim 6, wherein the predetermined acoustic startle boundary is a function of input signal rise time and SPL increase.

9. The system of claim 6, wherein the delta incident detector includes:
a fast lowpass filter associated with a short time constant and configured to generate mean square sound levels associated with the short time constant from input signals;
a medium lowpass filter associated with a medium time constant that is larger than the short time constant and configured to generate mean square sound levels associated with the medium time constant from input signals; and
a first comparator that compares a ratio between the mean square sound level outputs from the fast and medium lowpass filters to a first predetermined delta incident detection threshold to determine whether the input signals exceed the predetermined acoustic startle boundary.

10. The system of claim 9, wherein the delta incident detector further includes:
a slow lowpass filter associated with a long time constant that is larger than the medium time constant and configured to generate mean square sound levels associated with the long time constant from the input signals, the slow lowpass filter facilitates in measuring a recent average signal level and is further configured to be selectively enabled and disabled; and
a second comparator that compares a ratio between the mean square sound level outputs from the fast and slow lowpass filters to a second predetermined delta incident detection threshold, the second comparator facilitates in preventing false triggering of the delta incident detector during normal speech.

11. The system of claim 2, wherein:
the acoustic incident detector is an SPL incident detector configured to detect SPL acoustic incidents based on the estimated true SPL when the estimated true SPL exceed a predetermined SPL threshold; and
the acoustic incident limiter is an SPL limiter configured to determine an SPL gain in response to the SPL incident detector detecting an SPL acoustic incident, the SPL gain having an SPL gain limit, an SPL attack time and an SPL release time associated therewith, the amplifier being further configured to apply the SPL gain to the input signal, the amplifier being configured to apply the SPL gain to the input signal.

12. The system of claim 11, wherein, upon detection of the SPL acoustic incident by the SPL incident detector, the SPL limiter enters an SPL limiter attack phase in which the SPL limiter decreases the SPL gain over a period of time associated with the SPL attack time until the SPL gain reaches the SPL gain limit.

13. The system of claim 11, wherein, upon lack of detection of an SPL acoustic incident by the SPL incident detector, the SPL limiter enters an SPL limiter release phase if the SPL gain is less than unity (1) in which the SPL limiter increases the SPL gain over a period of time associated with the SPL release time until the SPL gain reaches unity (1).

14. A method for audio signal processing, comprising:
detecting delta acoustic incidents in input signals that exceed a predetermined acoustic startle boundary;
determining an anti-startle gain in response to the delta incident detector detecting a delta acoustic incident, the anti-startle gain having an anti-startle gain limit and an anti-startle release time associated therewith; and
applying the anti-startle gain to the input signals;
wherein the detecting the delta acoustic incident includes:
generating fast lowpass-filtered mean square sound levels associated with a short time constant from the input signals using a fast lowpass filter;
generating medium lowpass-filtered mean square sound levels associated with a medium time constant that is larger than the short time constant from the input signals using a medium lowpass filter;
comparing a ratio of the fast and medium lowpass-filtered mean square sound levels with a first predetermined delta incident detection threshold to determine whether the input signals exceed the predetermined acoustic startle boundary;
generating slow lowpass-filtered mean square sound levels associated with a long time constant that is larger than the medium time constant from the input signals using a slow lowpass filter, the slow lowpass filter facilitates in measuring a recent average signal level and is further configured to be selectively enabled and disabled; and
comparing a ratio of the fast and slow lowpass-filtered mean square sound levels with a second predetermined delta incident detection threshold to facilitate in preventing false detecting of the delta incident during normal speech.

15. A method for audio signal processing, comprising:
detecting delta acoustic incidents in input signals that exceed a predetermined acoustic startle boundary;
determining an anti-startle gain in response to the delta incident detector detecting a delta acoustic incident, the anti-startle gain having an anti-startle gain limit and an anti-startle release time associated therewith;
applying the anti-startle gain to the input signals; and
estimating a true sound pressure level (SPL) delivered by a transducer at a predetermined datum point from the input signals, wherein the detecting the delta acoustic incident is based on the estimated true SPL.

16. The method of claim 15, wherein estimating the true SPL is by performing single band, time domain processing implementing frequency-weighted SPL measurement.

17. The method of claim 15, wherein estimating the true SPL is by performing multi-band, frequency domain processing that applies a corresponding filter weight to each frequency band and implements a separate narrowband SPL measurement in each frequency band and a whole-band SPL measurement including the mean-square sum of the narrowband SPL measurements.

18. The method of claim 15, wherein the estimating the true SPL is based on a measured receiving frequency response of the transducer.

19. The method of claim 15, further comprising:
  detecting an SPL incident based on the estimated true SPL exceeding a predetermined SPL threshold;
  determining an SPL gain in response to detecting the SPL acoustic incident, the SPL gain having an SPL gain limit, an SPL attack time and an SPL release time associated therewith, the applying the anti-startle gain to the input signals further includes applying the SPL gain to the input signals.

20. The method of claim 19, wherein the determining the SPL gain includes:
  upon detection of the SPL acoustic incident, entering an SPL limiter attack phase by decreasing the SPL gain over a period of time associated with the SPL attack time until the SPL gain reaches the SPL gain limit.

21. The method of claim 19, wherein the determining the SPL gain includes:
  upon lack of detection of an SPL acoustic incident, entering an SPL limiter release phase if the SPL gain is less than unity (1) by increasing the SPL gain over a period of time associated with the SPL release time until the SPL gain reaches unity (1).

22. An audio signal processing method, comprising:
  estimating a true sound pressure level (SPL) delivered by a transducer at a predetermined datum point from input signals;
  detecting an acoustic incident based on the estimated true SPL and on a predetermined acoustic incident threshold;
  determining an acoustic incident gain in response to the acoustic incident detector detecting an acoustic incident; and
  applying the acoustic incident gain to the input signal.

23. The method of claim 22, wherein the estimating employs one of: (1) single band, time domain processing that implements frequency-weighted SPL measurement, and (2) multi-band, frequency domain processing that applies a corresponding filter weight to each frequency band and implements a separate narrowband SPL measurement in each frequency band and a whole-band SPL measurement including the mean-square sum of the narrowband SPL measurements.

24. The method of claim 22, wherein the estimating the true SPL is based on a measured receiving frequency response of the transducer.

25. The method of claim 22, wherein:
  the detecting includes detecting delta acoustic incidents in the input signals that exceed a predetermined acoustic startle boundary, and
  the determining includes determining an anti-startle gain in response to detecting the delta acoustic incident, the anti-startle gain having an anti-startle gain limit and an anti-startle release time associated therewith, the applying including applying the anti-startle gain to the input signal.

26. The method of claim 25, wherein, upon detecting the delta acoustic incident, the determining includes decreasing the anti-startle gain to the anti-startle gain limit and then increasing the anti-startle gain over a period of time associated with the anti-startle release time in a delta limiter release phase until the anti-startle gain reaches unity (1).

27. The method of claim 25, wherein the predetermined acoustic startle boundary is a function of input signal rise time and SPL increase.

28. The method of claim 25, wherein the detecting the delta acoustic incident includes:
  generating fast lowpass-filtered mean square sound levels associated with a short time constant from the input signals using a fast lowpass filter;
  generating medium lowpass-filtered mean square sound levels associated with a medium time constant that is larger than the short time constant from the input signals using a medium lowpass filter; and
  comparing a ratio of the fast and medium lowpass-filtered mean square sound levels with a first predetermined delta incident detection threshold to determine whether the input signals exceed the predetermined acoustic startle boundary.

29. The method of claim 28, wherein the detecting the delta acoustic incident further includes:
  generating slow lowpass-filtered mean square sound levels associated with a long time constant that is larger than the medium time constant from the input signals using a slow lowpass filter, the slow lowpass filter facilitates in measuring a recent average signal level and is further configured to be selectively enabled and disabled; and
  comparing a ratio of the fast and slow lowpass-filtered mean square sound levels with a second predetermined delta incident detection threshold to facilitate in preventing false detecting of the delta incident during normal speech.

30. The method of claim 22, wherein:
  the detecting includes detecting an SPL acoustic incident based on the estimated true SPL when the estimated true SPL exceeds a predetermined SPL threshold; and
  the determining includes determining an SPL gain in response to the SPL incident detector detecting the SPL acoustic incident, the SPL gain having an SPL gain limit, an SPL attack time and an SPL release time associated therewith, the amplifier being further configured to apply the SPL gain to the input signal, the applying including applying the SPL gain to the input signal.

31. The method of claim 30, wherein, upon detecting the SPL acoustic incident, the determining the SPL gain includes decreasing the SPL gain over a period of time associated with the SPL attack time until the SPL gain reaches the SPL gain limit in an SPL limiter attack phase.

32. The method of claim 30, wherein, upon lack of detecting an SPL acoustic incident, the determining the SPL gain includes entering an SPL limiter release phase if the SPL gain is less than unity (1) by increasing the SPL gain over a period of time associated with the SPL release time until the SPL gain reaches unity (1).

* * * * *